(12) United States Patent
Sternbergh et al.

(10) Patent No.: US 7,008,518 B2
(45) Date of Patent: Mar. 7, 2006

(54) METHOD AND APPARATUS FOR MONITORING OPTICAL CHARACTERISTICS OF THIN FILMS IN A DEPOSITION PROCESS

(75) Inventors: James Sternbergh, Healdsburg, CA (US); Eric M. Krisl, Santa Rosa, CA (US); Norm L. Boling, Santa Rosa, CA (US)

(73) Assignee: Deposition Sciences, Inc., Santa Rosa, CA (US)

( * ) Notice: Subject to any disclaimer, the term of this patent is extended or adjusted under 35 U.S.C. 154(b) by 0 days.

(21) Appl. No.: 11/036,326

(22) Filed: Jan. 18, 2005

(65) Prior Publication Data

US 2005/0167264 A1   Aug. 4, 2005

Related U.S. Application Data

(60) Provisional application No. 60/536,500, filed on Jan. 15, 2004.

(51) Int. Cl.
| C23C 14/34 | (2006.01) |
| B05C 11/00 | (2006.01) |
| G01N 33/00 | (2006.01) |

(52) U.S. Cl. .......................... 204/192.13; 204/298.03; 204/298.23; 427/8; 118/712; 73/866

(58) Field of Classification Search .......... 204/298.03, 204/298.23, 192.13; 118/712; 427/8; 73/866
See application file for complete search history.

(56) References Cited

U.S. PATENT DOCUMENTS

| 4,492,620 | A | | 1/1985 | Matsuo et al. | .......... 204/192.12 |
| 4,851,095 | A | | 7/1989 | Scobey et al. | .......... 204/192.12 |
| 5,122,252 | A | | 6/1992 | Latz et al. | ............. 204/298.26 |
| 5,169,509 | A | | 12/1992 | Latz et al. | ............. 204/298.03 |
| 5,292,417 | A | | 3/1994 | Kugler | ................... 204/192.13 |
| 5,546,179 | A | * | 8/1996 | Cheng | ......................... 356/73 |
| 5,849,162 | A | | 12/1998 | Bartolomei et al. | ... 204/192.13 |
| 5,893,952 | A | * | 4/1999 | Aronowitz et al. | .......... 118/725 |
| 6,426,793 | B1 | * | 7/2002 | Emonot | .................... 356/237.1 |
| 2002/0151092 | A1 | * | 10/2002 | Li et al. | ....................... 438/16 |
| 2004/0257588 | A1 | * | 12/2004 | Shchegrov et al. | .......... 356/601 |

* cited by examiner

*Primary Examiner*—Steven Versteeg
(74) *Attorney, Agent, or Firm*—Duane Morris LLP

(57) ABSTRACT

The present invention is directed at least in part to methods and apparatus for optically monitoring selected optical characteristics of coatings formed on substrates during the deposition process and controlling the deposition process responsive thereto. In one aspect, the system includes a retroreflector for reflecting an electromagnetic beam transmitted by the coating and substrate back through the substrate and coating before selected properties of the retroreflected beam are measured. The system and method improve the signal to noise properties of the measured beam. The present invention may be used in systems for coating one or an array of substrates, and is particularly suitable for deposition processes where the substrates are translated past the sources of material to be deposited, and wherein the angle of incidence of a monitor beam on the substrate changes as the substrate translates past the beam source.

43 Claims, 8 Drawing Sheets

Possible Arrangements for the Monitor and Beam Source

Possible Arrangements for the Monitor and Beam Source

METHOD AND APPARATUS FOR MONITORING OPTICAL CHARACTERISTICS OF THIN FILMS IN A DEPOSITION PROCESS

CLAIM OF PRIORITY

This application claims the benefit of the priority of U.S. Provisional Patent Application No. 60/536,500 filed Jan. 15, 2004, the entirety of which is incorporated herein by reference.

BACKGROUND OF THE INVENTION

The present invention relates generally to thin film coatings. More specifically, the present invention relates to methods and apparatus for monitoring selected optical characteristics of thin film coatings during the deposition process, and controlling the deposition process responsive thereto.

Optical filters comprising thin films, and particular multilayer films, have many commercial applications. For example, precision optical filters have found widespread use in the fiber optic telecommunications industry in Dense Wavelength Division Multiplexing ("DWDM"). It is well known that the performance of multi-layer thin film coatings can be improved by precisely controlling the thickness of the individual layers forming the multilayer coating.

In the example of DWDM filters, the filters are formed to transmit substantially all of the light within a corresponding wavelength band or channel while reflecting substantially all of the light outside of the channel. It is well known that an optical filter meeting the desired characteristics of transmitting substantially all of the light within a desired wavelength band and reflecting substantially all of the light outside of the band may be formed from a series of quarter wave stacks ("QWS") with interposed thick cavity layers. QWS filters may be formed by depositing alternating layers of materials having differing indices of refraction. Typically, one material (L) such as silica has a relatively low index of refraction, and the other material (H) such as tantalum pentoxide has a relatively high index of refraction. The QWS is formed by depositing a layer of H material, then a layer of L material, then a layer of H material, and so on until the filter reaches the desired optical characteristics.

When forming multi-layer thin film coatings, the optical performance of the coating can be greatly improved by precisely controlling the thickness of the individual layers. It is possible to mathematically calculate the desired thicknesses of the alternating layers and thus the "cut-off" points for each layer may be determined from the known deposition rate of each material. However, the known methods of depositing thin films are not accurate enough to rely solely on the mathematical calculation to control the deposition process. One known method to overcome the inaccuracies of the deposition process to obtain useful coatings is to control the deposition process as a function of the optical characteristics of the deposited coating.

For example, one known method of making precision optical filters is by forming the thin film coatings in an e-beam evaporation process with the assistance of an ion gun. With reference to FIG. 1, a deposition chamber 10 encloses the point sources 12, 14 of the H and L materials and the substrate 16 to be coated. Typically, the substrate 16 is circular having a diameter of about 3 inches and may be rotated at about 1000 rpm to improve the uniformity of the coating about the surface of the substrate. The materials may be deposited in alternate layers by alternating the activation of the sources of the materials. The thickness of each layer may be controlled by directing a beam of light 18 at the wavelength of interest ($\lambda c$) from the source 20 and monitoring the transmissivity of the coated substrate 16 at that wavelength $\lambda c$ by measuring the intensity of the light beam 18 at the detector 22. The deposition of each material may be "cut off" when the monitor shows that the thickness of the material being deposited has reached the "cut-off" point. The deposition process in an e-beam evaporation process typically takes about five minutes per layer.

However, as illustrated, such optical monitoring systems are found in systems where the position of the substrate relative to the source is fixed (although the substrate may be rotated about its axis). It is often desirable to form thin film coatings in "batch" processes where a large number of substrates forming an array is translated past the sources of material to be deposited. In such batch processes, it is known to optically monitor a witness substrate that remains stationary. However, due to the spatial variations of the coating flux within the deposition chamber, the array of substrates being coated are exposed to different coating fluxes from the other substrates in the array and the witness substrate and thus the coating is formed at a different rates on different substrates in the array. This leads to coating variations among the array of substrates. Uniformity of coating among the array of substrates may be improved by moving the substrates throughout the chamber, however, the witness substrate remains stationary. There remains a need for methods and apparatus for optically monitoring substrates that translate past the sources of coating material, and for optically monitoring multiple substrates in an array. There further remains a need for optically monitoring substrates wherein the angle of incidence of the monitoring beam changes as the substrate translates past the beam source.

Accordingly, it is an object of the present invention to obviate many of the above deficiencies in the prior art and to provide a novel method and apparatus for monitoring selected optical characteristics of a coating formed on a substrate during the deposition process.

It is another object of the present invention to provide a novel method and apparatus for monitoring selected optical characteristics of coatings formed on substrates translating past the source of coating material.

It is yet another object of the present invention to provide a novel method and apparatus for monitoring selected optical characteristics of coatings formed on multiple substrates in an array.

It is still another object of the present invention to provide a novel method and apparatus for monitoring selected optical characteristics of coatings formed on substrates where the angle of incidence of the monitor beam changes as the substrate translates past the beam source.

It is a further object of the present invention to provide a novel method and apparatus for monitoring selected optical characteristics of coatings formed on substrates in a sputter deposition process.

It is yet a further object of the present invention to provide a novel method and apparatus for monitoring selected optical characteristics of coatings formed on substrates in a sputter deposition process wherein the substrates are carried by a rotating drum.

It is still a further object of the present invention to provide a novel method and apparatus for improving the signal to noise ratio in systems for monitoring selected optical characteristics of coatings formed on substrates.

It is yet a further object of the present invention to provide a novel method and apparatus for aligning the components in systems for monitoring selected optical characteristics of coatings formed on substrates.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
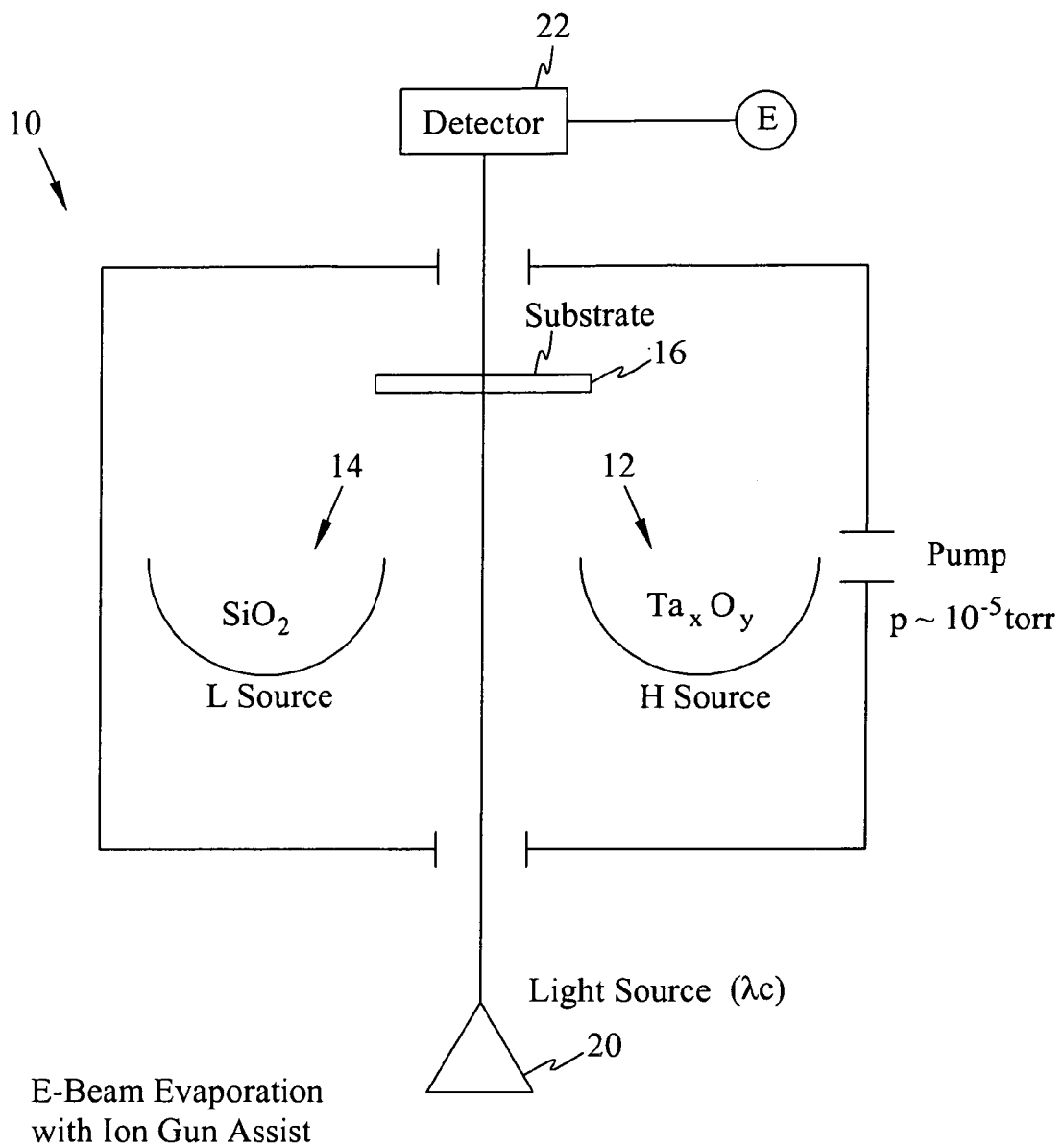
FIG. 1 is a schematic showing a prior art e-beam evaporation process having an optical monitoring system.

In the manufacture of precision optical filters comprising alternating layers of materials, it is critical that the thickness of the layers be precisely controlled during the deposition process. As discussed above, the optical properties of the deposited coating may be monitored so that the deposition of each layer is controlled as a function of the optical properties of the deposited coating.

According to one aspect of the present invention, a method and apparatus for real-time process control of thin film deposition in a deposition process is disclosed. The process control may be achieved by optically monitoring one or more optical characteristics of an electromagnetic beam after it is transmitted or reflected by the deposited coating, and using that measurement to determine the point in the deposition process at which the desired optical property is obtained for a single layer or a plurality of deposited layers, so that the deposition of each layer may be terminated accordingly.

Alternatively, in addition to the thickness of the layer, certain other parameters defining the end-point of a deposition layer may be selected and the real-time optical characteristics of the coating as it is being deposited may be measured to control the process to reach the desired end point. For example, a deposition time of 5 minutes per layer may be selected, and the deposition process parameters may be controlled as a function of the real-time measurement of the parameters so that the end point for the deposition of that layer is complete in 5 minutes.

One well known method of forming multi-layer thin film coatings is by sputter deposition, e.g., U.S. Pat. No. 5,849,162 to Bartolomei, et al., owned by the assignee of the present invention, the content of which is incorporated herein by reference, discloses methods and apparatus for reactive sputtering deposition processes. Another known reactive sputtering deposition system includes an array of substrates mounted on a rotating disk that carries the substrates past the sources of coating material. One of the advantages of producing precision optical filters in a sputter deposition process is the increase in the throughput compared to the coating processes presently used. In a sputter deposition process wherein an array of substrates is mounted on a rotatable drum having a diameter of one meter, approximately thirty two-inch substrates spaced apart by two inches, or approximately forty two-inch substrates spaced apart by one inch, may be mounted in a single row around the circumference of the drum. The time to coat the array of substrates is the same no matter how many substrates are in the array. Thus the throughput of the process, and subsequently the yield, may be greatly improved by performing the coating process on an array of substrates.

However, the process control in a sputter deposition process for an array of substrates is more complex than in a process for coating only one substrate. One option for process control as a function of the optical characteristics of each coated substrate, is to monitor each substrate in the array and control the process for each particular substrate as a function of the optical characteristics of that particular substrate.

The methods of control may vary. One option is to terminate the deposition for each substrate individually. A physical means to shield each substrate (e.g. a shutter) may be provided to terminate the deposition of each layer on an individual substrate when the coating on that substrate reaches the cut-off point for the layer being deposited. The sputter deposition of that material would continue until all of the substrates in the array reached the cut-off point for that layer.

Alternatively, the rate of deposition for each individual substrate may be controlled so that all of the substrates in the array reach the cut-off point at the same time. For example, if the deposition of a layer on a particular substrate was lagging the others, the amount of deposition for the next pass of that substrate past the target may be increased by increasing the target voltage, or by slowing the drum, as that substrate passed the target. Any other parameter which affects the amount of material deposited during a pass may also be controlled, such as the distance of the substrate from the target, or masking of the target or substrate.

Another advantage of a sputter deposition process is improved uniformity in the deposition rate which improves the accuracy in predicting the thickness of a deposited layer based on deposition rate and time. It has been discovered in the formation of QWS's in a sputter deposition process that the errors which are created in applying a few layers relying only on the predicted layer thickness based on the expected deposition rate and time to "predict" the cut-off point for each of those layers, may be corrected by monitoring a single layer and determining the cut-off point as a function of the optical characteristics of the deposited coating. Thus several unmonitored layers may be deposited and then a "correction layer" may be deposited to compensate for the errors resulting from the deposition of the unmonitored layers. This process reduces the amount of monitoring when coating an array of substrates. Any one of the techniques described above may be used for process control during the deposition of the correction layer. This process of depositing a few layers and then a correction layer may be repeated until the filter is completed.

For example, a correction layer may be deposited every 5th layer so that a correction layer is being deposited on a 5th of the substrates during the deposition of each layer. In an array of 40 substrates, only 8 substrates would need to be monitored during the deposition of a correction layer on those substrates, while the remaining 32 substrates received an unmonitored layer. The process is repeated by sequentially shifting the deposition of a correction layer to a different group of 8 substrates for each layer. Thus the process control may be simplified by simultaneously monitoring only a fraction of the substrates in the array.

In one aspect of the present invention, an apparatus and method are disclosed for depositing a thin film on an array of substrates in a sputter deposition process wherein the deposition is terminated for each substrate as a function of the optical characteristics of the film being deposited on that substrate. In one embodiment, the transmissivity of an electromagnetic beam having a desired wavelength through the thin film is measured to determine the desired thickness of the film.

In another aspect, the amount of material deposited on each substrate during a pass of the substrate past the sputtering target is controlled as a function of the optical characteristics of each substrate relative to the optical characteristics of the other substrates in the array. The process may include the steps of:

a. mounting an array of substrates on a drum or disk;
b. carrying the array of substrates past one or more sputter targets by rotating the drum or disk;
c. directing an electromagnetic beam through each substrate and coating deposited on the surface thereof, preferably at least once during each rotation of the drum or disk;
d. measuring the transmissivity of the beam through each substrate and coating; and
e. terminating the deposition of the material on each substrate as a function of the measured transmissivity of the beam through the substrate and coating.

or alternatively e. controlling the amount of material deposited on the substrate during the next past the one or more targets as a function of the measured transmissivity of the beam through the substrate and coating.

The amount of material deposited on the substrate may be controlled by one or more of several means including (i) varying the power applied to the target, (ii) varying the speed of the drum or disk, (iii) varying the distance of the substrate from the target, and (iv) variably masking the target or substrate.

In another embodiment, a method of forming multiple QWS's on an array of substrates may include:

controlling the deposition of a layer of material in the QWS on a portion of the substrates in an array of substrates as a function of the optical characteristics of the portion of substrates during the deposition of the layer; and repeating step (a) during the deposition of the next layer by monitoring a different portion of the array of substrates.

In another embodiment, a sputter deposition apparatus may include:

a rotatable drum adapted to carry an array of substrates about the cylindrical surface thereof (or a rotatable disk adapted to carry an array of substrates on the surface planar surface thereof) past one or more sputter targets;

an optical monitor adapted to measure the optical characteristics of an array of substrates carried by the drum (disk); and substrate shields which may be selectively deployed to mask the deposition of material on each individual substrate as a function of the optical characteristics of the substrate.

Alternatively, the apparatus may include:

c. means for controlling one or more parameters which affect the amount of material deposited on each individual substrate during a pass of the substrate past the sputter targets as a function of the optical characteristics of the substrate. The parameters may include, but are not limited to, one or more of the following: target voltage, drum (disk) rotation rate, distance between target and substrate, masking of target or substrate.

In another embodiment, a method of sputter deposition may include process control as a function of the optical characteristics of (i) a first selected portion of an array of substrates during the deposition of a first layer on the entire array; (ii) a second selected portion of an array of substrates during the deposition of a second layer on the entire array, (iii) a third selected portion of an array of substrates during the deposition of a third layer on the entire array, and so on until each selected portion of the array has been monitored for the deposition of a layer. The process is repeated until the coating is complete.

Figure 2:
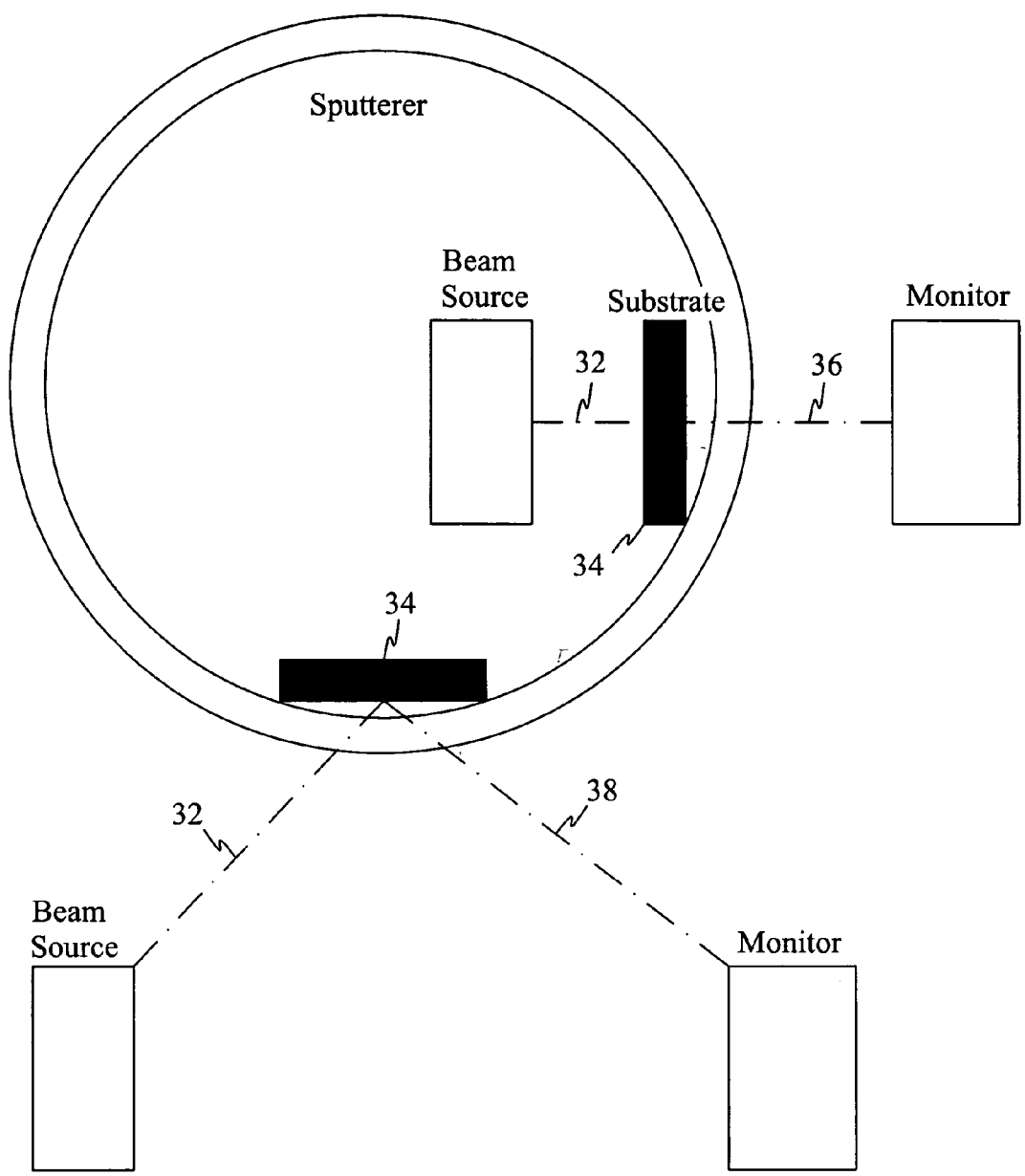
FIGS. 2 and 3 are illustrations showing various arrangements for optical monitoring systems according to the present invention.
Figure 3:
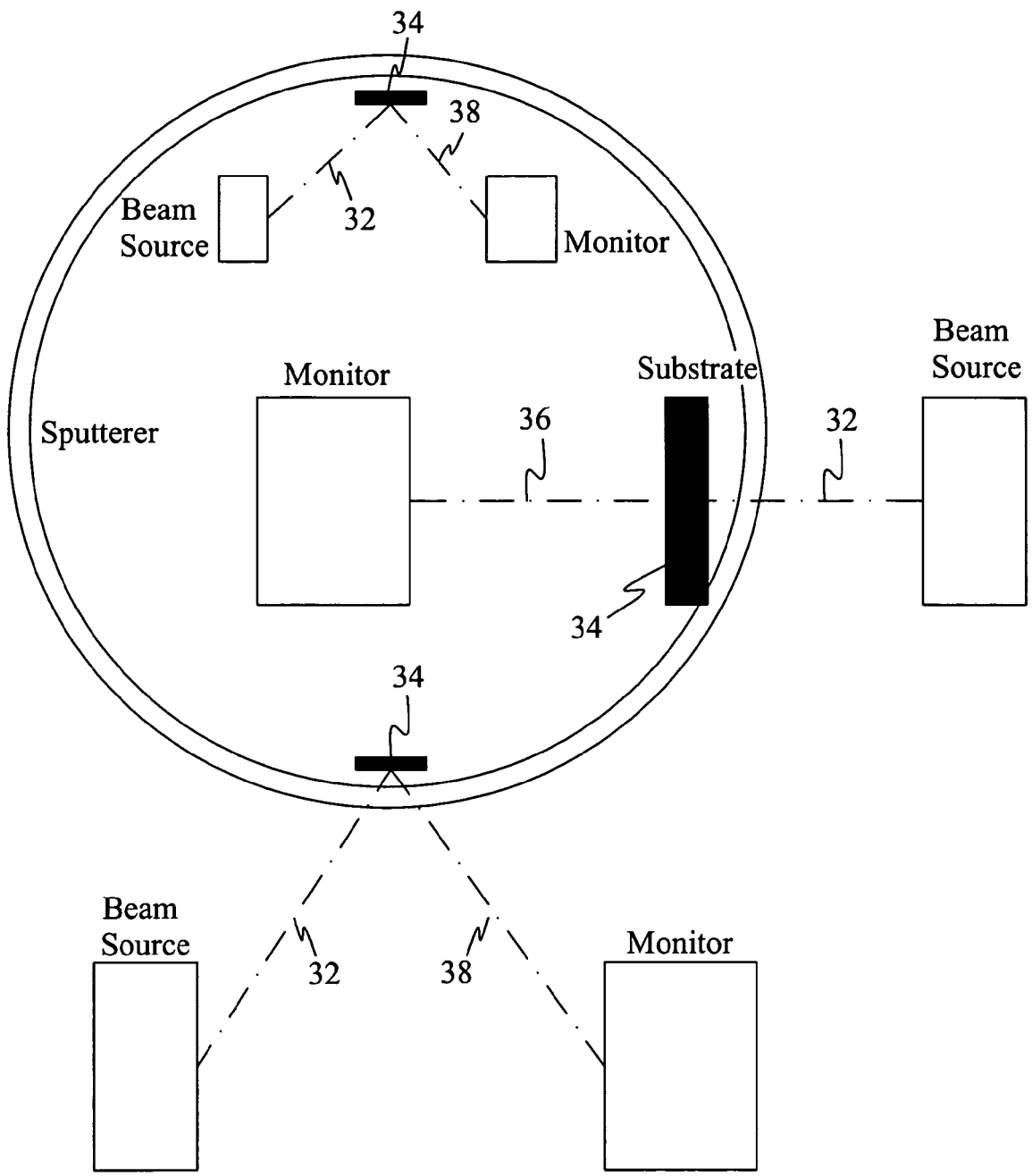

In an embodiment of the present invention as applied to a batch coating system and method (e.g., the systems and methods disclosed in U.S. Pat. No. 5,849,162 to Bartolomei et al.) some of the possible coating apparatus configurations which incorporate optical monitoring for real-time process control are illustrated in FIGS. 2 and 3. With reference to FIGS. 2 and 3, an incident electromagnetic beam 32 is directed at the substrate 34 to be monitored, and either the transmitted beam 36, or the reflected beam 38 may be measured to determine the optimum point to terminate the deposition of the layer being deposited. A single wavelength laser may be used in the monitoring process, or a fast tuning laser may be used so that different substrates may be monitored at different wavelengths using the same laser source. A white light source may also be used.

Figure 4:
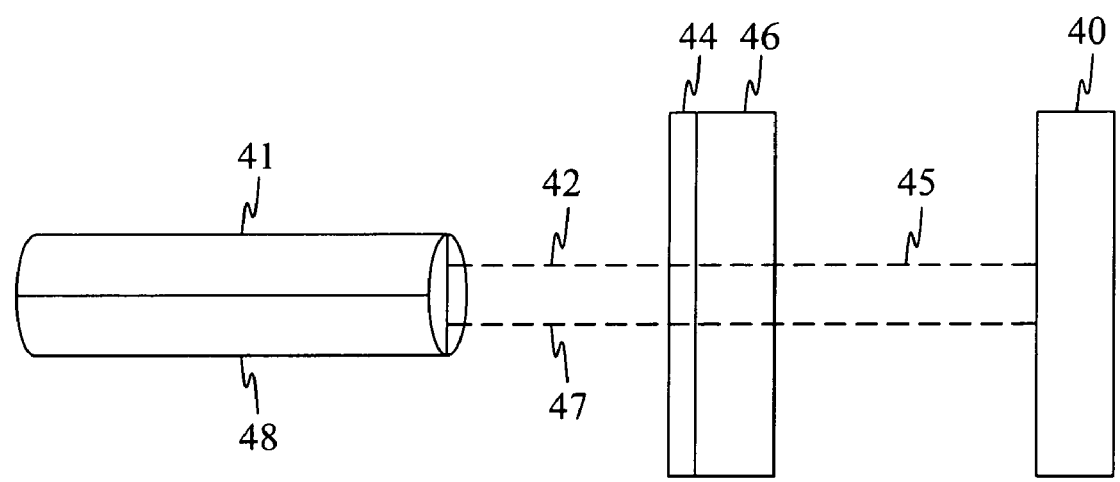
FIG. 4 is an illustration of the arrangement of components in an optical monitoring system according to another aspect of the present invention.

FIG. 4 illustrates another embodiment of the present invention. With reference to FIG. 4, a source 41 of an electromagnetic beam 42 directs the beam 42 to the coating 44 formed on the substrate 46. A reflecting optic 40 is positioned to reflect the monitor beam 45 transmitted by the coating 44 and substrate 46 back through the substrate and coating to the detector 48.

One advantage of this system is an improved signal to noise property in the reflected beam 47 received by the detector 48. By transmitting the monitor beam twice through the coating and substrate before measuring the desired properties of the beam, the total transmission is squared while the noise remains nearly constant. Thus actual changes in the transmission due to changes in the optical characteristics of the coating are easier to distinguish from the noise in the system.

Figure 5:
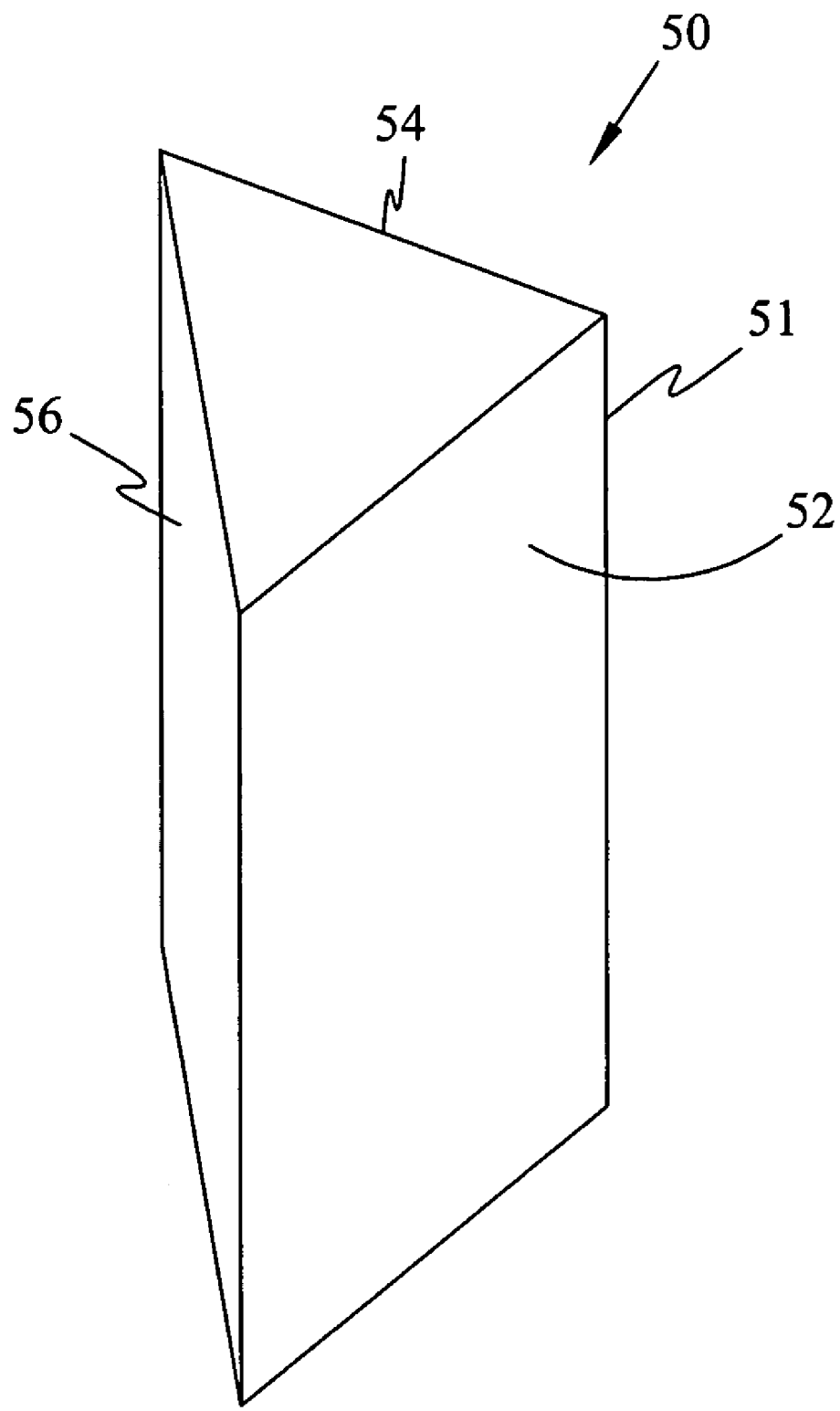
FIG. 5 is an illustration of a retroreflector including a right angle prism according to one aspect of the present invention.

In one embodiment, the reflecting optic comprises a retroreflector, i.e., a reflector in which the reflected rays are returned in directions substantially opposite to the direction of the incident rays. With reference to FIG. 5, the retroreflector 50 may comprise an elongated right angle prism 51 having substantially perpendicular faces 52,54 and face 56 forming the hypotenuse of the right angle prism. The retroreflector is positioned so that a monitor beam transmitted by a coating and substrate is incident on the face 56 and is retroreflected by the substantially perpendicular faces 52 and 54. The internal reflection of the faces 52,54 may be solely relied on for the retrorefelction of the incident beam. Alternatively, a reflective coating may be applied the faces 52,54.

Figure 6:
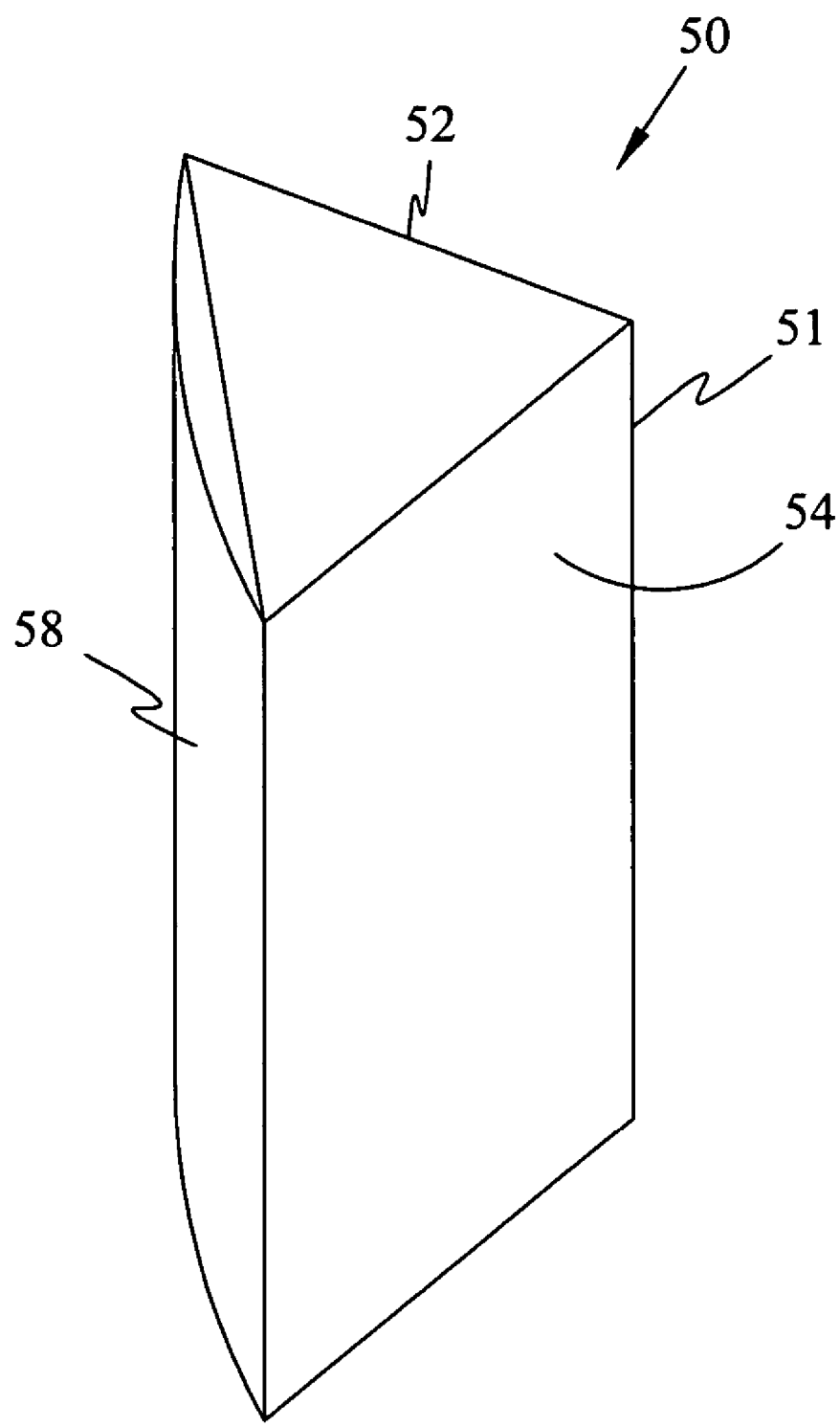
FIG. 6 is an illustration of the retroreflector shown in FIG. 5 having a plano-convex lens positioned adjacent one face of the prism.

With reference to FIG. 6, a plano-convex lens 58 may be positioned adjacent the face 56. The focal length of the lens is selected so that incident beams are collimated when passing the face 56 into the prism.

Figure 7:
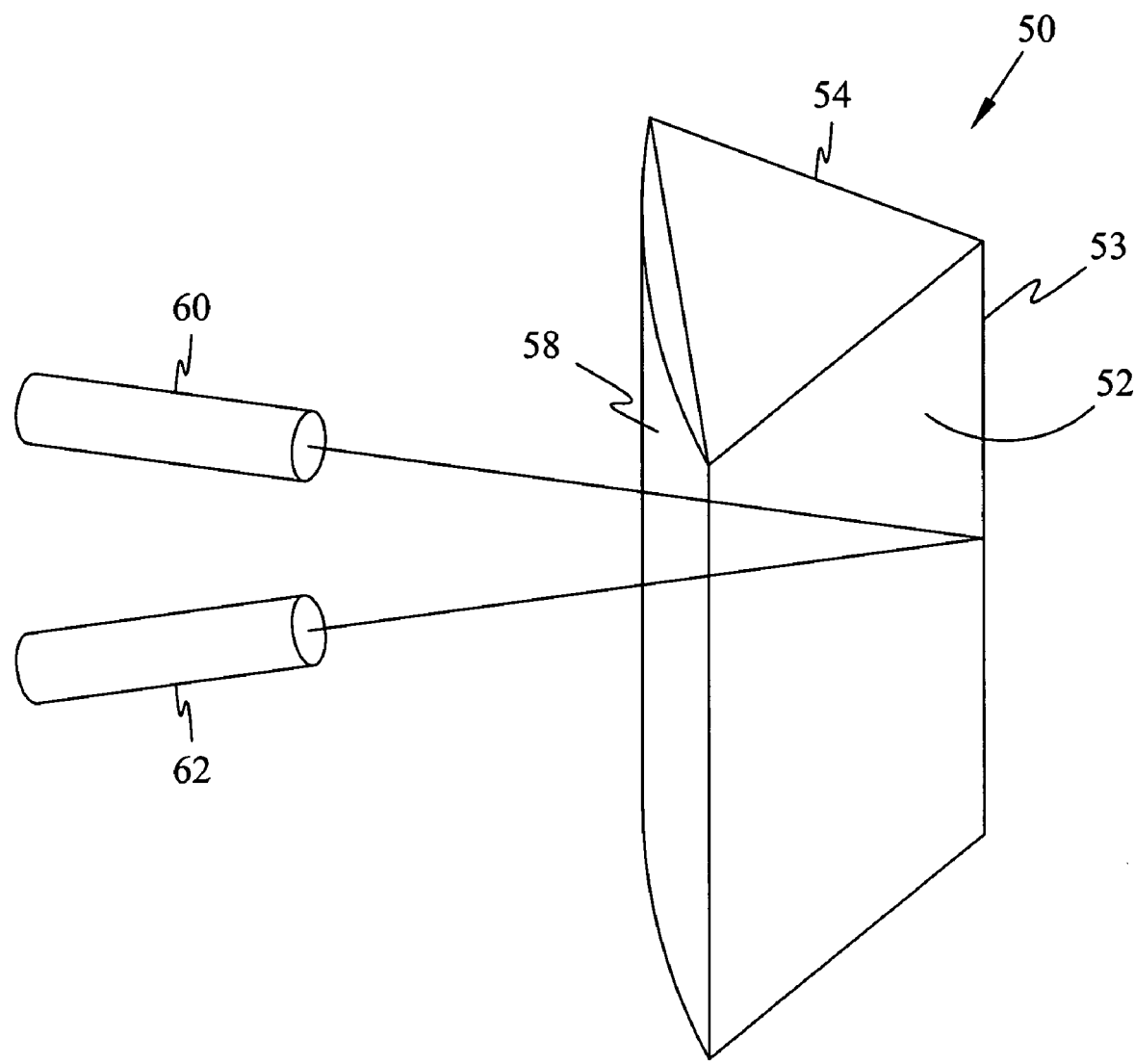
FIG. 7 is an illustration of the arrangement of components in an optical monitoring system according to one aspect of the present invention including the retroreflector illustrated in FIG. 6.

With reference to FIG. 7, in one embodiment of the present invention using the retroreflector 50 illustrated in FIG. 6, the axes of the source 60 and the detector 62 are substantially coplanar, and the plane containing the axes is substantially parallel with the edge 53 of the right angle prism 51 formed by the substantially perpendicular faces 52,54. In such a configuration, the optical alignment of the components in the direction normal to the plane containing the axes of the source and detector is automatic due to the retroreflective properties of the retroreflector. Thus the optical alignment of the components is critical only in the plane of the source and detector axes. Thus optical alignment of such a system is simplified over systems that do no utilize a retroreflector minimizing the possibility of interrupting coating processes due to loss of the monitor signal at the detector.

The optical monitoring systems of the present invention are particularly advantageous in improving optical monitoring in coating systems where the angle of incidence of the monitor beam changes as the substrate translates past the beam source. One such system is the drum-type sputter coating system disclosed in Bartolomei et al. In order to incorporate process control as a function of the optical properties of the deposited coating in a sputter deposition apparatus and process such as the apparatus and process disclosed in Bartolomei et al., several factors must be considered. In the typical coating process for depositing layers to form multi-layer thin film coatings such as disclosed in Bartolomei et al., the drum has a diameter of about 0.6 to 1 meter and rotates at about 1 rps. Assuming a substrate size of about two inches, the substrate will pass in front of the stationary monitoring beam for about 20 ms. Thus there is very little time to collect the optical data per pass. The process is further complicated by the non-uniformity of the coating across the substrate and the change in the angle of incidence of the monitoring beam to the substrate during the pass due to the curvature of the drum which is about 3° to 4° during the pass.

Figure 8:
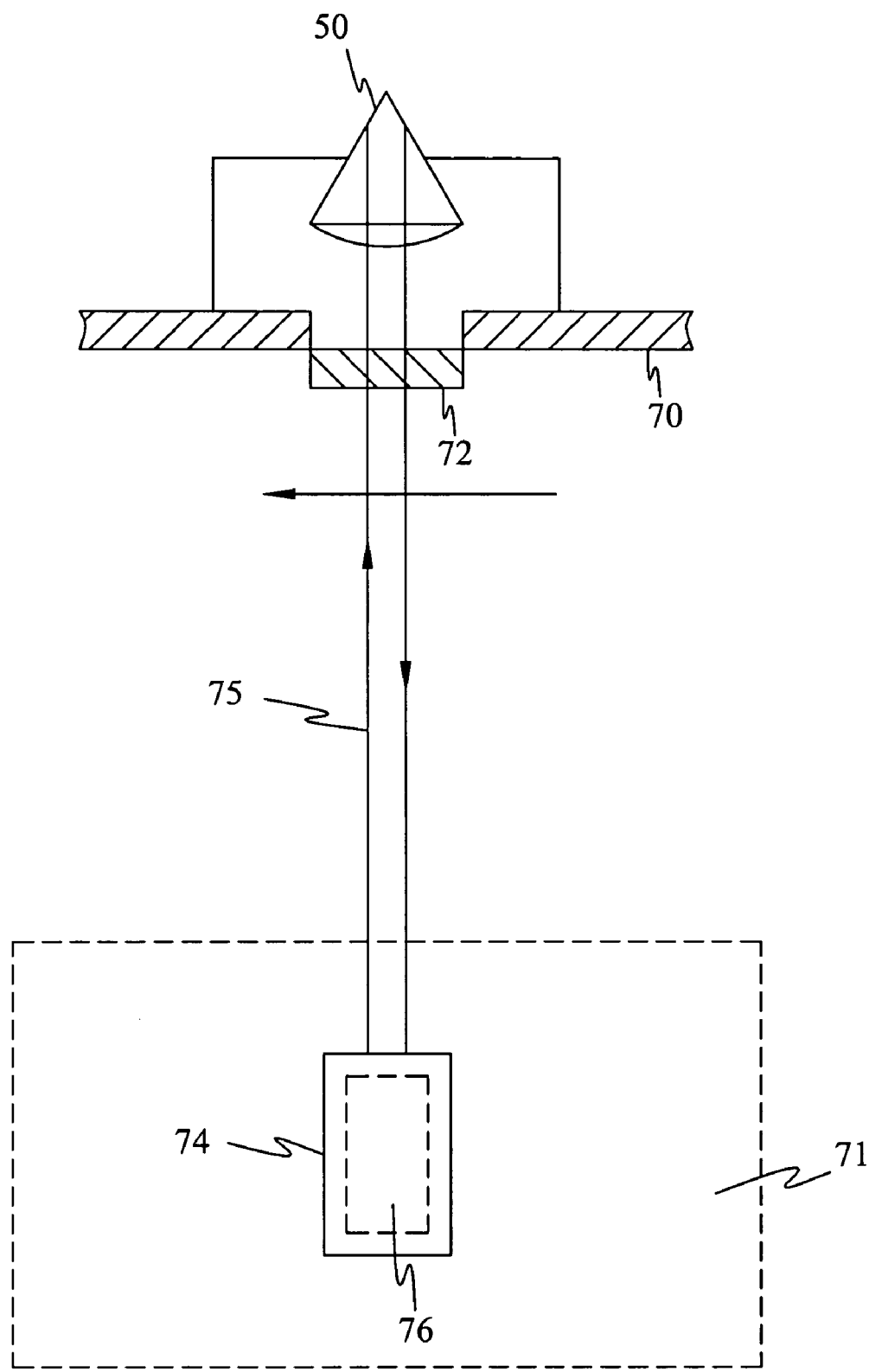
FIG. 8 is an illustration of an optical monitoring system according to one aspect of the present invention where the substrate translates past the monitoring station.

In such systems, the use of a retroreflector maximizes the useful time for measuring the optical characteristics of the coating on the substrate during each pass of the substrate past a monitoring station because the angle of incidence of the monitor beam does not need to be perpendicular to the plane of the substrate in order to measure the characteristics of the coating. With reference to FIG. 8, the substrate carrier 70 carries the substrate 72 past the monitoring station 71 where the position of the source 74 and the detector 76 are fixed. The axes of the source 74 and the detector 76 are coplanar, and the plane containing the axes is substantially parallel to the long axis of the retroreflector 50 and substantially perpendicular to the velocity of the substrate 72 translating past the monitoring station. As illustrated, the monitor beam 75 is substantially perpendicular to the substrate 72 as it translates in the direction of the arrow past the monitoring station 71. Due to the curvature (not shown) of the generally cylindrical substrate carrier 70 (i.e., drum), the angle of incidence of the beam to the substrate changes as the substrate translates past the beam source. However, due to the retroreflective characteristics of the retroreflector 50, the system is able to receive retroreflected beams that are transmitted by the substrate at angles other than right angles to the substrate as the substrate approaches and departs the position where the beam is perpendicular to the substrate. Thus the useful time for monitoring the optical characteristics of the coating formed on the substrate is increased by the use of a retroreflector.

In one embodiment, the reflective optics may be carried by the substrate carrier (e.g., a drum or disk) so that the position of the reflector is fixed relative to the substrate. In this embodiment, and number of substrates may be measured in an array as desired to improve process control and uniformity of the coatings in the array.

In one aspect of the present invention, an apparatus and method are disclosed for depositing a thin film on a substrate in a sputter deposition process wherein the deposition is terminated and/or otherwise controlled as a function of the optical characteristics of the film being deposited. In one embodiment, the transmissivity of an electromagnetic beam having a desired wavelength through the thin film is measured to determine the desired thickness of the film. The process may include the steps of:

mounting a substrate on the surface of a drum;

rotating the drum to thereby carry the substrate past one or more sources of material to be deposited to thereby effect the deposition of the material on the substrate;

directing an electromagnetic beam through the substrate and coating deposited on the surface thereof at least once during each rotation of the drum;

measuring the transmissivity of the beam through the substrate and coating;

terminating the deposition of the material as a function of the transmissivity of the beam through the substrate and coating.

One embodiment is an apparatus for producing a layer in an optical filter, the layer having a pre-selected reflection, absorption or transmission of wavelength $\lambda c$, which may include:

a rotatable drum (disk) having a substrate mounted thereon;

one or more sputter targets;

a laser having a desired wavelength (the laser may be a fast tuning laser tuned to the desired wavelength, or a white light source), the laser being disposed on one side of the drum and being positioned to pass through the substrate during rotation of the drum;

a monitor disposed on the side of the drum (disk) opposite the laser, the monitor being positioned to measure the transmission of the laser through the substrate;

a computer for determining the desired point in the process to terminate the deposition of material, the computer may perform one or more of the following:

assembling and integrating the monitor's data output for each separate pass through the substrate, filtering out statistical noise, correcting or compensating for the angle of incidence of the monitor's beam, the spin, rotation, or unevenness of the surface, the wobbling or other movement of the substrate, the angle of incidence and the variation of the reflected transmitted or absorbed wavelength, temperature changes in the substrate and film stack, mathematically modeling the intensity curve, calculating the time, cycle number, or monitor level at which the desired transmission at $\lambda$ or other wavelength is reached, recalculating the modeled curve based on the repetition of A–F with each pass or selection of passes of substrate through the monitor; and a means for:
ceasing deposition when the desired pre-selected optical characteristic has been attained, or
ceasing deposition when the time, cycle number, or monitor reading predicted for optimal deposition has been reached, or
modulating the reaction parameters to alter the rate of deposition so that the desired optical characteristics are attained by the pre-selected reaction endpoint.

Another method for producing a layer in an optical filter, having a pre-selected reflection, absorption or transmission of wavelength λc, using real-time calculation of the deposition reaction endpoint, may include:

f. directing a laser of wavelength λc (or a fast tuning laser) at a substrate during a reactive sputtering coating process;

g. measuring the intensity of the beam after it passes through or is reflected off of the optical film with an optical monitor;

h. mathematically modeling the maximum or minimum transmission, reflection or absorption of the layer using the monitor's data output; and i. terminating the deposition when the maximum or minimum transmission, reflection or absorption has been attained, or terminating deposition when the time predicted for that optimal film thickness has been reached.

Alternatively, a white light may be directed at the substrate and the intensity of the light at the wavelength of interest may be measured.

Yet another method for producing a layer in an optical filter, having a pre-selected reflection, absorption or transmission of wavelength λ, using real-time monitoring of the deposition reaction and real-time feedback reaction condition modulation, may include:

a. sputter depositing one or more materials on a substrate by periodically passing the substrate past one or more sputtering targets;

b. providing an electromagnetic beam of a desired wavelength or plurality of desired wavelengths;

c. passing the substrate through the beam so that the beam is substantially normal to the surface of the substrate;

d. measuring and recording the energy of the beam reflected, absorbed, or transmitted by the substrate and coating thereon;

e. analyzing and modeling the data collected by the monitor to determine the reaction parameter or parameters that should be modulated to obtain the desired optical properties of the coated substrate, the parameters including, but not limited to,
  A. the target voltage
  B. the distance between the target and the substrate, and
  C. rate of drum (disk) rotation; and f. continually updating the model and modulating reaction conditions through a feedback system.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A sputter coating system comprising:
a sputtering chamber having a coating station and a monitoring station;
a sputtering target positioned within said chamber at said coating station;
a substrate carrier positioned within said chamber and rotatable about an axis;
an array of substrates carried by said carrier past said coating station and said monitoring station, each substrate having an exposed surface to be coated;
a source of an electromagnetic beam positioned at said monitoring station, said source being positioned so that said beam is incident on the exposed surface of a substrate passing by said monitoring station;
one or more reflectors carried by said carrier, each of said reflectors being positioned adjacent a different substrate on the side of the substrate remote from the exposed surface for reflecting a beam transmitted through the substrate back through the substrate; and
a detector positioned at said monitoring station for measuring the beams reflected by said one or more reflectors.

2. The system of claim 1 wherein one or more of said reflectors comprise retroreflectors.

3. The system of claim 2 wherein said retroreflectors comprise an elongated right angle prism positioned so that the long axis of the prism is substantially parallel to the axis of rotation of said carrier.

4. The system of claim 3 wherein the retroreflector further comprises a plano-convex lens positioned adjacent the planar surface forming the hypotenuse of the right angle prism.

5. The system of claim 3 wherein a plane including the axes of the source and the detector is substantially perpendicular to the axis of rotation of said carrier.

6. The system of claim 1 wherein said source and said detector are positioned outside said chamber.

7. The system of claim 1 wherein said carrier comprises disk or a drum.

8. A sputter coating system comprising:
a sputtering chamber having a coating station and a monitoring station;
a sputtering target positioned within said chamber at said coating station;
a disk having a generally planar surface positioned within said chamber and rotatable about an axis substantially perpendicular to said generally planar surface;
an array of substrates carried by said disk on said generally planar surface past said coating station and said monitoring station, each substrate having an exposed surface to be coated;
a source of an electromagnetic beam positioned at said monitoring station, said source being positioned so that said beam is incident on the exposed surface of a substrate passing by said monitoring station;
one or more reflectors carried by said disk, each of said reflectors being positioned adjacent a different substrate on the side of the substrate remote from the exposed surface for reflecting a beam transmitted through the substrate back through the substrate; and
a detector positioned at said monitoring station for measuring the beams reflected by said one or more reflectors.

9. An apparatus comprising:
a chamber having a thin film coating station and an optical monitoring station;
one or more sources of coating material positioned within said chamber at said coating station;
a substrate mounting and moving means for carrying one or more substrates past said coating station and said optical monitoring station;
one or more substrates mounted on said mounting and moving means;

a source of an electromagnetic beam positioned at said optical monitoring station so that the electromagnetic beam provided by said source is incident on each substrate carried past said monitoring station; and a monitor positioned at said coating station for measuring a monitor beam, said monitor beam being the transmission of the incident beam through the substrate or the reflection of the incident beam from the substrate.

10. The apparatus of claim 9 wherein the monitor measures the transmission of the electromagnetic beam through the substrate.

11. The apparatus of claim 10 further comprising a reflector positioned on the side of the substrate remote from said source for reflecting the electromagnetic beam transmitted through the substrate back through the substrate to said monitor.

12. The apparatus of claim 11 wherein said reflector comprises a retroreflector.

13. The apparatus of claim 9 further comprising a means for ceasing the deposition of the coating material on a substrate responsive to the measurement of the monitor beam.

14. The apparatus of claim 13 wherein said means comprises a shutter which shields the substrate from the sources of coating material.

15. The apparatus of claim 13 wherein said mounting and moving means comprises a disk or a drum.

16. A system for controlling the deposition of a coating on an array of substrates by monitoring selected optical characteristics of the coating on one or more substrates, the system having a source of an electromagnetic beam and a detector for measuring the transmission of the beam through the coating on one or more substrates, the improvement comprising a reflector for reflecting a beam transmitted by the coating on the one or more substrates back through the substrate and coating to the detector.

17. The system of claim 16 wherein said reflector comprises a retroreflector.

18. The system of claim 16 wherein the position of the reflector is fixed relative to the coating on the substrate being monitored.

19. A system for monitoring selected optical properties of a coating formed on a substrate, said system comprising an electromagnetic beam source and detector positioned on the same side of said substrate and a reflector positioned on the side of the substrate remote from said source and said detector.

20. The system of claim 19 wherein said coating is formed on one side of said substrate and said source and said detector are positioned on the coated side of the substrate.

21. The system of claim 19 wherein the position of the reflector is fixed relative to the substrate.

22. A system for monitoring selected optical properties of a coating formed on a substrate translating past a source of an electromagnetic beam wherein the angle of incidence of said beam on said coating changes during said translation, said system comprising a source of said electromagnetic beam, a retroreflector positioned to reflect the beam transmitted through said coating and substrate, and a detector positioned to measure the reflected beam.

23. The system of claim 22 wherein said retroreflector comprises an elongated right angle prism, and wherein the axes of said source and said detector are substantially coplanar and parallel to the edge of said prism formed by the intersecting perpendicular faces.

24. The system of claim 22 wherein the position of said retroreflector is fixed relative to said substrate.

25. The system of claim 24 wherein said substrate is positioned adjacent the face forming the hypotenuse of said right angle prism.

26. The system of claim 25 further comprising a plano-convex lens positioned between said prism and said substrate.

27. A system for monitoring selected optical properties of a coating formed on a substrate translated past one or more sources of coating material, said system comprising a source of an electromagnetic beam having a position fixed relative to said one or more sources of coating material, a detector having a position fixed relative to said source, and a reflector having a position fixed relative to said substrate, said reflector reflecting the beam transmitted by said coating and substrate through the coating and substrate to said detector.

28. The system of claim 27 wherein said reflector comprises an elongated right angle prism positioned so that the long axis of said prism is substantially perpendicular to the velocity of said translating substrate.

29. The system of claim 28 further comprising a drum rotatable about its axis, said substrate and said reflector being carried by said drum, said reflector being positioned so that the long axis of said prism is substantially parallel to the axis of said drum.

30. The system of claim 28 further comprising a disk having a generally planar surface rotatable about an axis substantially perpendicular to said generally planar surface, said substrate and said reflector being carried by said disk, said reflector being positioned so that the long axis of said prism is substantially parallel to a radius of said disk.

31. A method of optically monitoring selected optical characteristics of a coating on one or more substrates in a sputter deposition process, said method comprising the steps of:

translating one or more of the substrates past a monitoring station;

directing an electromagnetic beam through the coating formed on one or more of the substrates as the substrate passes the monitoring station;

reflecting the beam transmitted through the coating and substrate back through the coating and substrate;

measuring selected properties of the reflected beam; and determining selected optical characteristics of the coating.

32. The method of claim 31 further comprising the step of controlling one or more deposition parameters responsive to the measurement of the selected optical properties.

33. In a process of monitoring selected optical characteristics of a coating formed on a substrate by directing an electromagnetic beam through the coating and measuring selected optical properties of the transmitted beam, a method of improving the signal to noise ratio of the measured beam comprising the step of reflecting the transmitted beam back through the coating before measuring the beam.

34. The method of claim 33 comprising the step of retroreflecting the transmitted beam to a detector for measuring the selected optical properties of the retroreflected beam.

35. A method of monitoring selected optical characteristics of a coating on one or more substrates comprising the steps of;

directing an electromagnetic beam through the coating and substrate;

retroreflecting the beam transmitted through the coating and substrate; and measuring selected optical characteristics of the retroreflected beam.

36. The method of claim 35 further comprising the step of translating the substrate past the electromagnetic beam.

37. The method of claim 36 wherein the angle of incidence of the beam on the coating changes during translation of the substrate past the beam.

38. The method of claim 35 wherein the step of retroreflecting comprises retroreflecting in two dimensions.

39. The method of claim 38 further comprising the step of translating the substrate past the electromagnetic beam.

40. The method of claim 39 wherein the velocity of the translating substrate is substantially perpendicular to a plane containing the incident beam and the reflected beam.

41. A method of monitoring selected optical properties of a coating formed on a substrate translating past a source of an electromagnetic beam wherein the angle of incidence of the beam on the coating changes during the translation, said method comprising the steps of:

directing the beam through the coating as the substrate translates past the source;

retroreflecting the beam transmitted through the coating; and measuring selected properties of the retroreflected beam.

42. The method of claim 41 comprising the step of fixing the position of a retroreflector relative to the substrate.

43. A method of optically monitoring selected optical characteristics of a coating formed on one or more substrates comprising the steps of:

directing an electromagnetic beam so that the beam is incident on the coating;

measuring selected properties of the beam transmitted through the coating or reflected from the coating;

determining selected optical characteristics of the coating; and retroreflecting the beam transmitted through the coating.

* * * * *